United States Patent
Cheng et al.

(10) Patent No.: US 11,521,701 B2
(45) Date of Patent: Dec. 6, 2022

(54) MEMORY CONTROLLER WITH READ ERROR HANDLING

(71) Applicant: YANGTZE MEMORY TECHNOLOGIES CO., LTD., Wuhan (CN)

(72) Inventors: Boxuan Cheng, Wuhan (CN); Wei Tao, Wuhan (CN); Weizhen Kong, Wuhan (CN); Jian Cao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 17/352,246

(22) Filed: Jun. 18, 2021

(65) Prior Publication Data

US 2022/0319624 A1   Oct. 6, 2022

Related U.S. Application Data

(63) Continuation of application No. PCT/CN2021/083886, filed on Mar. 30, 2021.

(51) Int. Cl.
  *G11C 29/42* (2006.01)
  *H03M 13/11* (2006.01)

(52) U.S. Cl.
  CPC ......... *G11C 29/42* (2013.01); *H03M 13/1108* (2013.01)

(58) Field of Classification Search
  CPC .......................... G11C 29/42; H03M 13/1108
  See application file for complete search history.

(56) References Cited

U.S. PATENT DOCUMENTS

| | | | |
|---|---|---|---|
| 2017/0125127 A1* | 5/2017 | Kim | G06F 11/1048 |
| 2020/0036392 A1* | 1/2020 | Jeong | H03M 13/1108 |
| 2020/0081775 A1* | 3/2020 | Jeon | G06F 3/0619 |
| 2020/0118620 A1* | 4/2020 | Bazarsky | G11C 29/42 |
| 2020/0133767 A1* | 4/2020 | Yang | H03M 13/1111 |

FOREIGN PATENT DOCUMENTS

| | | |
|---|---|---|
| CN | 101673226 A | 3/2010 |
| CN | 108399108 A | 8/2018 |
| CN | 109753375 A | 5/2019 |

OTHER PUBLICATIONS

International Search Report issued in corresponding International Application No. PCT/CN2021/083886, dated Dec. 30, 2021, 5 pages.

* cited by examiner

*Primary Examiner* — Thien Nguyen
(74) *Attorney, Agent, or Firm* — Bayes PLLC (57) ABSTRACT

In certain aspects, a controller for controlling a memory device includes a memory and a processor. The memory is configured to store instructions. The processor is coupled to the memory and configured to execute the instructions to perform a process including receiving data describing a read failure of a set of error handling mechanisms, where the read failure indicates that the set of error handling mechanisms handles a read error on a block of the memory device and fails to read data stored in the block; and responsive to the read failure of the set of error handling mechanisms, performing a memory test on the block to determine whether the block malfunctions.

20 Claims, 6 Drawing Sheets

MEMORY CONTROLLER WITH READ ERROR HANDLING

CROSS-REFERENCE TO RELATED APPLICATIONS

This application is continuation of International Application No. PCT/CN2021/083886, filed on Mar. 30, 2021, entitled "MEMORY CONTROLLER WITH READ ERROR HANDLING," which is hereby incorporated by reference in its entirety.

BACKGROUND

The present disclosure relates to memory controllers and methods thereof.

Flash memory is a low-cost, high-density, non-volatile solid-state storage medium that can be electrically erased and reprogrammed. Flash memory includes an array of memory cells that can be organized into blocks, and can be erased, written, and read block-wise. During a life span of Flash memory, a threshold voltage of a memory cell in a block may be shifted due to various factors. For example, the threshold voltage can be changed due to an increased usage time, a change in an external environment (e.g., a temperature change), and existence of a manufacturing defect, etc. A shift on the threshold voltage of the memory cell may cause a read error on the block, and data stored in the block may be lost if the read error is unsolvable.

SUMMARY

In one aspect, a controller for controlling a memory device includes a memory and a processor. The memory is configured to store instructions. The processor is coupled to the memory and configured to execute the instructions to perform a process including receiving data describing a read failure of a set of error handling mechanisms, where the read failure indicates that the set of error handling mechanisms handles a read error on a block of the memory device and fails to read data stored in the block; and responsive to the read failure of the set of error handling mechanisms, performing a memory test on the block to determine whether the block malfunctions.

In another aspect, a system includes a memory device and a controller. The memory device is configured to store data and includes an array of memory cells. The array of memory cells is organized into a plurality of blocks. The controller is coupled to the memory device and configured to control the memory device. The controller includes a memory and a processor. The memory is configured to store instructions. The processor is coupled to the memory and configured to execute the instructions to perform a process including receiving data describing a read failure of a set of error handling mechanisms, where the read failure indicates that the set of error handling mechanisms handles a read error on a block of the memory device and fails to read data stored in the block; and responsive to the read failure of the set of error handling mechanisms, performing a memory test on the block to determine whether the block malfunctions.

In still another aspect, a method for handling a read error on a block of a memory device is included. Data describing a read failure of a set of error handling mechanisms is received. The read failure indicates that the set of error handling mechanisms handles the read error on the block and fails to read data stored in the block. Responsive to the read failure of the set of error handling mechanisms, a memory test is performed on the block to determine whether the block malfunctions.

According to yet another aspect, a method for handling a read error on a block of a memory device is included. Data describing a read failure of a set of error handling mechanisms is received. The read failure indicates that the set of error handling mechanisms handles the read error on the block and fails to read data stored in the block. Responsive to the read failure of the set of error handling mechanisms, a memory test is performed on the block to determine whether the block fails the memory test. Responsive to the block failing the memory test, the block is identified as a bad block.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

A read error may occur to a block of a memory device (e.g., Flash memory) due to a current leakage problem (or, a charge leakage problem) in a memory cell within the block. The current leakage problem may be incurred by a defect in the memory cell. For example, the defect can incur a current leakage from a first word line to a second word line, or a current leakage from a word line to a channel hole. Through repeat erasing and writing on the block, stress can be produced on the defective memory cell, which may cause the current leakage problem to be more and more serious. In some cases, the current leakage problem can incur an uncorrectable read error in a word line coupled to the defective memory cell, such that data stored in memory cells coupled to the word line cannot be restored. Also, a probability of a data loss on other word lines of a same redundant array of independent disks (RAID) stripe can be increased due to the current leakage problem. As a result, the integrity and reliability of data storage in the memory device are affected.

Besides, the current leakage problem may incur a great number of read errors on the memory device, resulting in a generation of a great number of error codes. Each error code may trigger a series of error handling mechanisms to be executed. For example, data stored in the memory device is processed using low density parity check (LDPC) codes for error correction purposes. When an error code is generated to indicate a read error on a block, a first mechanism can be implemented to handle the read error. The first mechanisms can use a default read voltage to read the data stored in the block, and apply an LDPC hard decoding strategy for data decoding. If the first mechanism fails to read the data stored in the block, a second mechanism can be implemented to handle the read error on the block. The second mechanism can use a set of read voltages in a read-retry table to read the data stored in the block, and apply the LDPC hard decoding strategy for data decoding. If the second mechanism also fails to read the data stored in the block, a third mechanism can be implemented to handle the read error. The third mechanism can use a set of shifted read voltages to read the data stored in the block, and apply an LDPC soft decoding strategy for data decoding. If the third mechanism also fails to read the data stored in the block, a fourth mechanism can be implemented to use a RAID data restoration strategy to handle the read error. If the fourth mechanism also fails to read the data stored in the block, a data loss on the block is reported to a host.

During implementations of the error handling mechanisms, a read delay of the second mechanism is higher than a page read delay, where the page read delay represents a delay by merely reading data stored in a page in which the block locates. This is because the second mechanism has to iterate a read operation over all read voltage combinations (e.g., 23 read voltage combinations) in the read-retry table and then apply the LDPC hard decoding strategy accordingly. A read delay of the third mechanism is also higher than the page read delay due to the implementation of the LDPC soft decoding strategy. Particularly, a read delay of the fourth mechanism is much higher than the page read delay, because all word lines within a same RAID stripe need to be read (e.g., an entire array of memory cells within the same RAID stripe needs to be read). As a result, a frequent triggering of the error handling mechanisms may increase a total read delay of the memory device.

Furthermore, even although the data stored in the block cannot be read successfully, the above error handling mechanisms fail to identify the block as a bad block no matter whether the failure on the block is temporary (e.g., caused by a dramatic temperature change between a writing time and a reading time) or irrecoverable (e.g., due to a more and more severe current leakage caused by a physical defect). If the failure on the block is irrecoverable, repeat erasing and writing on the block may not only cause a data loss on the block repeatedly, but also lead to an obvious decrease in the reading speed of the memory device.

To address the aforementioned issues, the present disclosure introduces a solution in which a memory test can be performed on a block with a read error to determine whether the block is malfunctioning. For example, when one or more error handling mechanisms fail to handle the read error on the block (e.g., failing to read data stored in the block), the memory test can be performed on the block to determine whether the block is a bad block. If the block has an insurmountable defect, a failure on the block can be permanent or irrecoverable, and the block can be labeled as a bad block. By identifying the block with the insurmountable defect to be a bad block, the block may not be used again for any future data storage, so that a potential data loss on the block can be avoided. Also, a potential triggering of the error handling mechanisms due to read errors on the block can be prevented. A read delay of the memory device and a potential decrease in the reading speed of the memory device caused by repeat erasing and writing on the block can be avoided. As a result, the reading speed of the memory device can be enhanced, and the integrity and reliability of data storage in the memory device can be improved.

Figure 1:
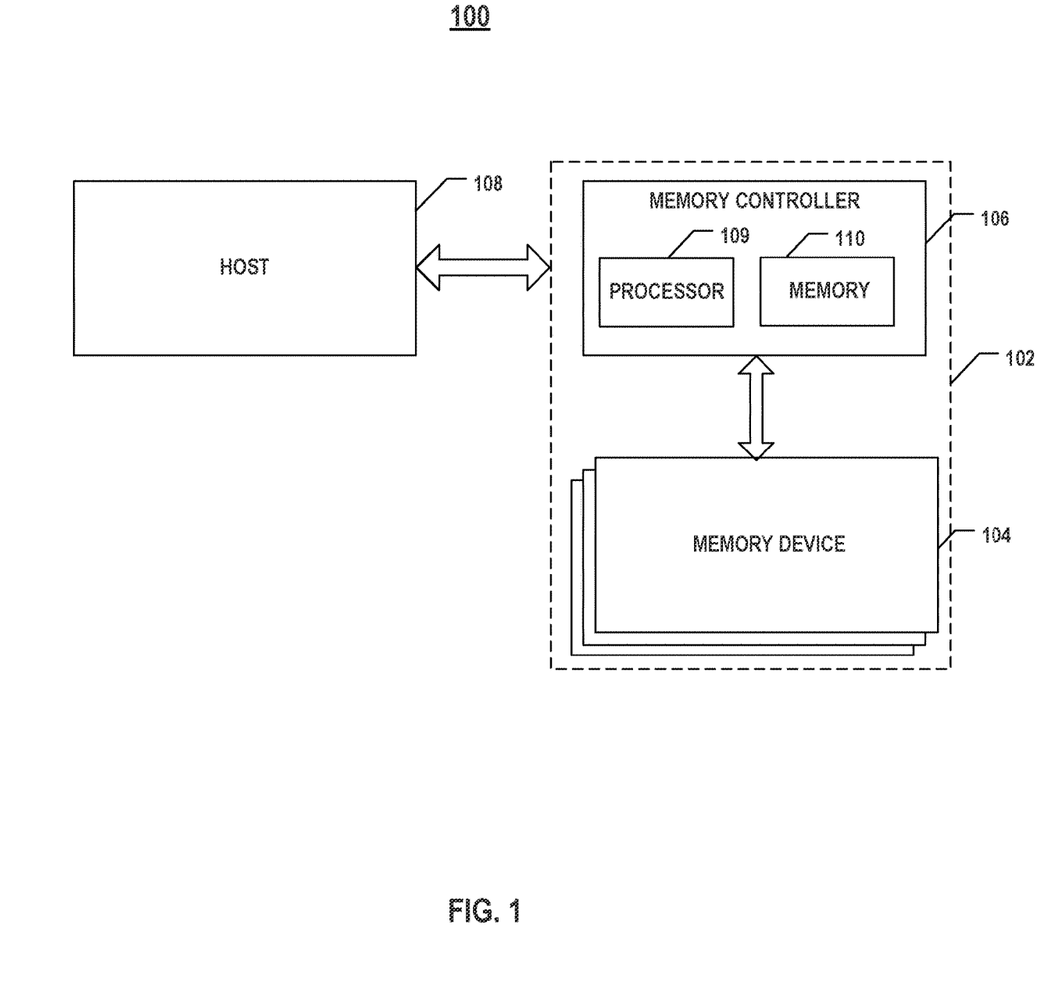
FIG. 1 illustrates a block diagram of an exemplary system having a memory controller and a memory device, according to some aspects of the present disclosure.

FIG. 1 illustrates a block diagram of an exemplary system 100 having a memory device and a memory controller, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from memory devices 104.

Memory device 104 can be any memory device disclosed in the present disclosure. For example, memory device 104 can be a NAND Flash memory device or a NOR Flash memory device. In some implementations, a RAID structure can be implemented in memory device 104. For example, RAID 5 is used in memory device 104. RAID 5 employs striping in blocks to divide the data in the blocks into a plurality of data portions, performing exclusive or (XOR) operations amongst data portions in the stripe to generate respective parity data, and stores the parity data in the memory cells. One data portion can represent the data in one page. One stripe often includes data portions located in two-dimensions, e.g., laterally in different blocks across different dies and different planes, and vertically in different levels in the same blocks. For example, for blocks in 4 planes and 4 dies, a stripe can include 128 data portions, distributed laterally (e.g., in all the planes and dies) and vertically (e.g., in more than one level). Laterally, the stripe can include data portions at the same locations in different planes. Vertically, the stripe can include data portions at the same locations at different levels. The last data portion often includes the parity data of the stripe. In case of programming failure in one data portion of a stripe, the compromised data portion can be recovered, e.g., by performing XOR operations, using the parity data of the stripe and the rest of the data portions in the stripe. For example, for a stripe that has 128 data portions, 127 data portions are used to store the memory data, and one data portion is used to store the parity data of the stripe. An error correction capability of RAID 5 using such striping configuration can thus be described as (127+1).

Memory controller 106 is coupled to memory device 104 and host 108 and is configured to control memory device 104, according to some implementations. Memory controller 106 can manage the data stored in memory device 104 and communicate with host 108. In some implementations, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to, bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

In some implementations, memory controller 106 can include a processor 109 and a memory 110. Processor 109 can be any suitable type of processors, for example, a CPU, a microprocessor, a microcontroller unit (MCU), an SoC, or an AP, etc. Processor 109 may include various computing architectures including a complex instruction set computer (CISC) architecture, a reduced instruction set computer (RISC) architecture, or an architecture implementing a combination of instruction sets. Although only a single processor is shown in FIG. 1, multiple processors may be included. Processor 109 can be configured to send or receive data to or from memory 110. For example, processor 109 can be configured to receive instructions from memory 110 and execute the instructions to provide the functionality described herein.

Memory 110 stores data (e.g., instructions or any other suitable data) that may include code or routines for performing part of or all of the techniques described herein. Memory 110 may be a dynamic random-access memory (DRAM) device, a static random-access memory (SRAM) device, a hard disk drive, a flash memory device (e.g., NAND Flash memory device or NOR Flash memory device), or some other suitable memory device.

Figure 2A:
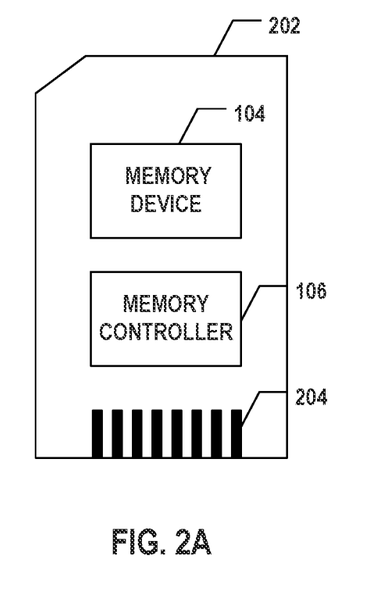
FIG. 2A illustrates a diagram of an exemplary memory card having a memory controller and a memory device, according to some aspects of the present disclosure.
Figure 2B:
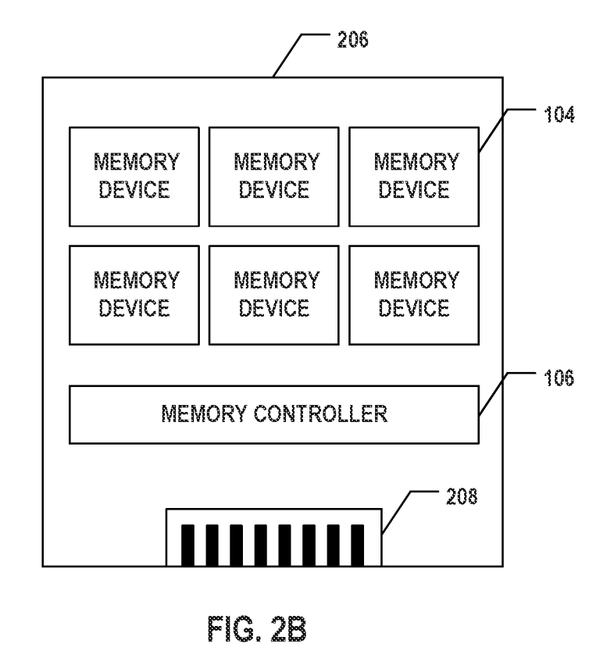
FIG. 2B illustrates a diagram of an exemplary solid-state drive (SSD) having a memory controller and a memory device, according to some aspects of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106 and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
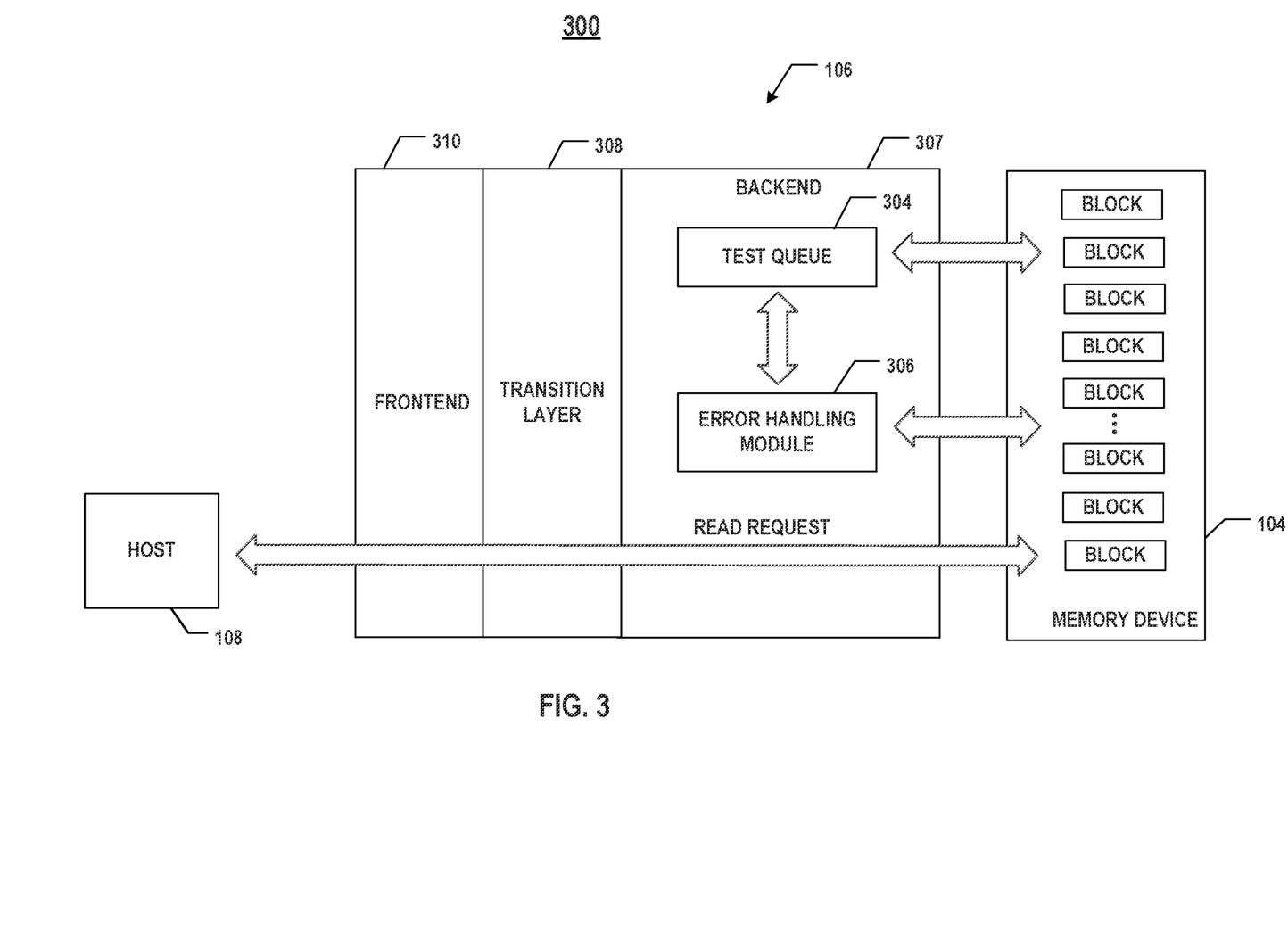
FIG. 3 illustrates a block diagram of an exemplary memory controller interacting with a host and a memory device, according to some aspects of the present disclosure.

FIG. 3 illustrates a block diagram 300 of an exemplary memory controller (e.g., memory controller 106) interacting with host 108 and memory device 104, according to some aspects of the present disclosure. Memory device 104 can include a plurality of blocks for storing data received from host 108 or any other external device. Memory controller 106 can be coupled to host 108 and memory device 104. Memory controller 106 can include a backend 307, a transition layer 308, and a frontend 310.

Frontend 310 may be configured to handle communications between host 108 and memory controller 106. Frontend 310 can include code or routines stored in memory 110, when executed by processor 109, causing processor 109 to provide the functionality described herein. In some implementations, frontend 310 may communicate with host 108 according to a particular communication protocol. For example, frontend 310 may communicate with host 108 through at least one of various interface protocols, such as a USB protocol, an MMC protocol, a PCI protocol, a PCI-E protocol, an ATA protocol, a serial-ATA protocol, a parallel-ATA protocol, a SCSI protocol, an ESDI protocol, an IDE protocol, a Firewire protocol, etc.

In some implementations, frontend 310 can receive a request from host 108 and forward the request to backend 307 via transition layer 308, so that backend 307 can fulfill the request. Examples of a request can include, but are not limited to, a read request to read data stored in a block of memory device 104, a write request to erase data stored in a block of memory device 104 and to write new data into the block, a reformatting request to reformat memory device 104, or any other suitable request. In some implementations, frontend 310 can receive data from backend 307 via transition layer 308, and send the data to host 108.

Transition layer 308 may be configured to handle communications between frontend 310 and backend 307. Transition layer 308 can act as an intermediate layer between frontend 310 and backend 307. Transition layer 308 can include code or routines stored in memory 110, when executed by processor 109, causing processor 109 to provide the functionality described herein.

Backend 307 can include code or routines stored in memory 110, when executed by processor 109, causing processor 109 to provide the functionality described herein. Backend 307 can be configured to fulfill requests from host 108. In some implementations, backend 307 can receive a request from host 108 via frontend 310 and transition layer 308, and perform one or more operations to fulfill the request. For example, backend 307 can be configured to control operations of memory device 104 (e.g., read, erase, or program operations) in response to receiving a request from host 108 (e.g., a read request, an erasing request, or a programming request). Backend 307 can also be configured to manage various functions with respect to the data stored or to be stored in memory device 104 including, but not limited to, bad-block management, or garbage collection, etc.

In some implementations, backend 307 is further configured to process error correction codes with respect to the data read from or written to memory device 104. Example error correction codes can include, but are not limited to, Hamming codes, Reed-Solomon codes, LDPC codes, etc. For example, backend 307 can read data from a block of memory device 104 in response to a read request, and process error correction codes to determine whether data stored in the block is read successfully (e.g., with no errors). If the data stored in the block is read successfully, backend 307 may forward the data to frontend 310 via transition layer 308, so that frontend 310 can return the data to host 108. However, if the data stored in the block is not read successfully, backend 307 may generate data describing a read error on the block.

In some implementations, backend 307 can be further configured to handle the read error on the block. For example, backend 307 can include an error handling module 306 configured to handle the read error on the block. Error handling module 306 can include code or routines stored in memory 110, when executed by processor 109, causing processor 109 to provide the functionality described herein. As described below in more detail, error handling module 306 can be configured to implement a set of error handling mechanisms to handle the read error on the block. Responsive to the set of error handling mechanisms being able to read the data stored in the block successfully, error handling module 306 can return the data to host 108. However, responsive to the set of error handling mechanisms also failing to read the data stored in the block, error handling module 306 may perform a memory test on the block to determine whether the block malfunctions (e.g., whether the block is a bad block). Error handling module 306 can update a mapping table of memory device 104 by adding a newly discovered bad block to the mapping table. The mapping table can be used to record any bad blocks of memory device 104, and can be stored in memory device 104 or memory 110 of memory controller 106.

For example, LDPC codes can be used for error correction purposes with respect to the data read from or written to memory device 104. As a result, an LDPC hard decoding strategy or an LDPC soft decoding strategy can be used during a decoding process for data read from memory device 104. The set of error handling mechanisms may include, but is not limited to, one or more of the following: (1) a first mechanism that uses a default read voltage to read the data stored in the block and applies the LDPC hard decoding strategy for data decoding; (2) a second mechanism that uses a set of read voltages in a read-retry table to read the data stored in the block and applies the LDPC hard decoding strategy for data decoding; (3) a third mechanism that uses one or more shifted read voltages to read the data stored in the block and applies the LDPC soft decoding strategy for data decoding; and (4) a fourth mechanism that uses a RAID data restoration strategy to handle the read error on the block.

In the second mechanism, the read-retry table may include various read voltage combinations that can be applied to read data. For example, the read-retry table may include 23 read voltage combinations. The read-retry table can be configured during the manufacture of memory controller 106. The second mechanism may iterate a read operation on the block using all read voltage combinations in the read-retry table, and apply the LDPC hard decoding strategy during a decoding process for the data retrieved from the block.

The third mechanism may use a set of shifted read voltages to read the data stored in the block. A probability of error for each data bit can be determined. The third mechanism may apply the LDPC soft decoding strategy during a decoding process for the data retrieved from the block.

In the fourth mechanism, the RAID data restoration strategy can read on all word lines within a same RAID stripe where the block locates. For example, the RAID data restoration strategy reads data from an entire array of memory cells within the same RAID stripe of memory device 104. Within an error correction capability of a RAID structure, the fourth mechanism may correct read errors (if there is any) in the data based on parity data of the RAID stripe. For example, for a stripe in RAID 5 that has 128 data portions, 127 data portions are used to store data, and 1 data portion is used to store parity data of the stripe. In case of one data portion of the stripe is compromised, the compromised data portion can be recovered, e.g., by performing XOR operations, using the parity data of the stripe and the rest of the data portions in the stripe. However, if there are two or more comprised data portions in the stripe of RAID 5, the two or more comprised data portions may not be recovered using the parity data of the stripe because it is out of the error correction capability of the RAID 5 structure.

In some implementations, when a read error on a block of memory device 104 is received, error handling module 306 can apply the first mechanism to handle the read error on the block and determine whether the first mechanism reads the data stored in the block successfully. Responsive to the first mechanism reading the data stored in the block successfully, error handling module 306 can return the data to host 108 via transition layer 308 and frontend 310. Or, responsive to the first mechanism failing to read the data stored in the block, error handling module 306 can generate data describing a read failure of the first mechanism, and then apply the second mechanism to handle the read error on the block to determine whether the second mechanism can read the data stored in the block successfully.

Responsive to the second mechanism reading the data stored in the block successfully, error handling module 306 can return the data to host 108 via transition layer 308 and frontend 310. Or, responsive to the second mechanism also failing to read the data stored in the block, error handling module 306 can generate data describing a read failure of the second mechanism, and then apply the third mechanism to handle the read error on the block to determine whether the third mechanism can read the data stored in the block successfully.

Responsive to the third mechanism reading the data stored in the block successfully, error handling module 306 can return the data to host 108 via transition layer 308 and frontend 310. Or, responsive to the third mechanism also failing to read the data stored in the block, error handling module 306 can generate data describing a read failure of the third mechanism, and then apply the fourth mechanism to handle the read error on the block to determine whether the fourth mechanism can read the data stored in the block successfully.

Responsive to the fourth mechanism reading the data stored in the block successfully, error handling module 306 can return the data to host 108 via transition layer 308 and frontend 310. Or, responsive to the fourth mechanism also failing to read the data stored in the block, error handling module 306 can generate data describing a read failure of the fourth mechanism, and then report a data loss on the block to host 108.

In some implementations, if one or more error handling mechanisms fail to read the data stored in the block, error handling module 306 can be configured to perform a memory test on the block to determine whether the block malfunctions. For example, error handling module 306 can perform the memory test on the block if one or more of the first, second, third, and fourth mechanisms fail to read the data stored in the block successfully. The memory test can be performed in the background to minimize any impact on the performance of system 102.

In some implementations, before performing the memory test on the block, error handling module 306 may include the block in a test queue 304. For example, error handling module 306 may push the block to test queue 304 (e.g., including an identifier of the block in test queue 304). Error handling module 306 may also mark the block as a temporary bad block, so that the block may not be accessed before the memory test is performed on the block. Test queue 304 can be configured to include a set of blocks waiting to be tested by the memory test. For example, test queue 304 may include a list of identifiers of the blocks waiting to be tested by the memory test.

In some implementations, error handling module 306 may determine whether there is any task to be fulfilled with higher priority than the memory test. If there is a task to be fulfilled with higher priority than the memory test, error handling module 306 may wait until the task with higher priority is fulfilled by backend 307 and then perform the memory test. A task to be fulfilled with higher priority than the memory test can be, for example, a request to be fulfilled with higher priority than the memory test. If there is no task to be fulfilled with higher priority than the memory test, error handling module 306 may perform the memory test based on test queue 304.

Alternatively or additionally, error handling module 306 may determine whether there are sufficient resources available for performing the memory test (e.g., sufficient computing power, memory space, bandwidth, etc., for performing the memory test). If there are sufficient resources available for performing the memory test, error handling module 306 may perform the memory test for one or more blocks in test queue 304. Otherwise, error handling module 306 may wait until sufficient resources are available for the memory test.

In some implementations, error handling module 306 may perform the memory test for each block in test queue 304 in sequence. For example, a first block in test queue 304 is processed first, and a last block in test queue 304 is processed last (e.g., first in first out). Or, the first block in test queue 304 is processed last, and the last block in test queue 304 is processed first (e.g., last in first out). In some other implementations, error handling module 306 can perform the memory test for the blocks in test queue 304 based on the total number of visits to each block. For example, a block that is frequently accessed by host 108 can be processed before a block that is infrequently accessed by host 108.

Here, a block to be tested by the memory test may be referred to as a block under test if no ambiguity is incurred. The memory test may include a set of test routines or test procedures configured for determining whether a block under test is malfunctioning. For example, the memory test can be used to determine whether the block under test is a bad block (e.g., a block that has a physical defect and cannot be used to store data any more). In some implementations, the test routines or test procedures included in the memory test can be configured during the manufacture of memory controller 106.

Error handling module 306 may determine whether the block under test passes the memory test. If the block fails the memory test, error handling module 306 can mark the block as a bad block. The block may be added to a mapping table of memory device 104. In this case, the read error on the block may be caused by a physical defect, and the read failure on the block is irrecoverable or permanent. For example, during the memory test, error handling module 306 may apply different read voltages with different time durations to a word line coupled to the block, and detect an output current of each memory cell in the block to determine whether there is any abnormality occurring to the output current. If there is an abnormality occurring to an output current of a particular memory cell in the block (e.g., the memory cell has a serious current leakage problem), error handling module 306 may determine that the memory cell is damaged, and the block is marked as a bad block.

On the other hand, if the block passes the memory test, error handling module 306 may identify the block as a candidate block for recycling during a garbage collection of memory device 104. In this case, the read failure on the block is temporary. For example, the read failure on the block may be caused by a dramatic temperature change between a writing time and a reading time of the block (e.g., the block is written in an environment with a very low temperature and read in an environment with a very high temperature). The block can be erased and reused to store new data. For example, error handling module 306 can release the block from a list of temporary bad blocks, and push the block to a target block list of the garbage collection, so that the block can be recycled during the garbage collection and reused for data storage again.

From the above description for FIG. 3, when a read error occurs to a block of memory device 104 and a set of error handling mechanisms also fails to handle the read error on the block (e.g., also failing to read data stored in the block successfully), a memory test can be performed on the block to determine whether the block is a bad block. If the block is a bad block, the failure on the block can be permanent or irrecoverable (e.g., due to a severe current leakage caused by a physical defect). By identifying the block with an irrecoverable failure to be a bad block, the block may not be used again for future data storage so that a potential data loss on the block can be avoided. Additionally, a potential decrease in the reading speed of memory device 104 caused by repeat erasing and writing on the block can also be avoided. As a result, the reading speed of memory device 104 can be enhanced, and the integrity and reliability of data storage in memory device 104 can be improved.

Figure 4:
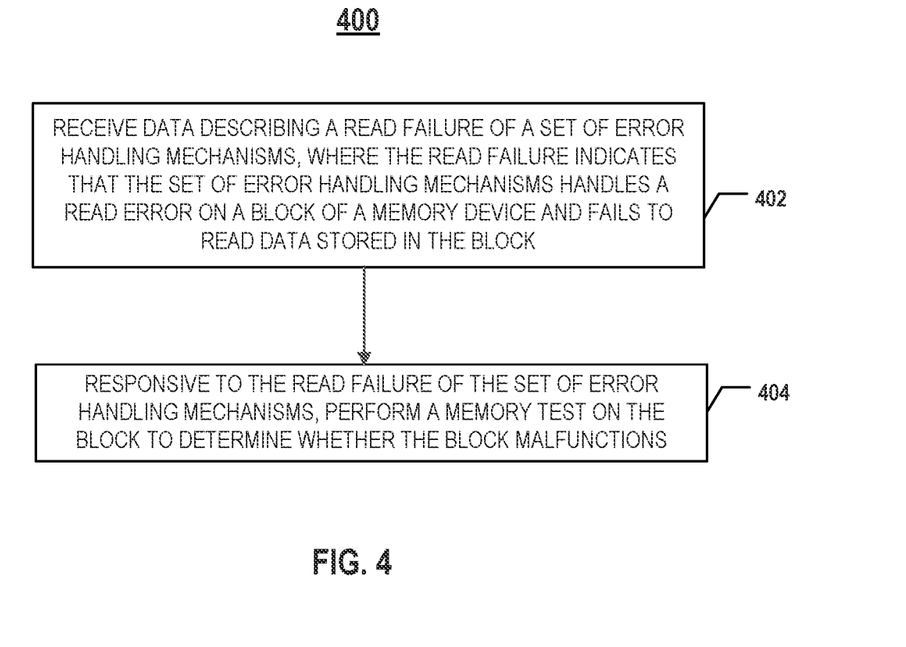
FIG. 4 illustrates a flowchart of a method for handling a read error on a block of a memory device, according to some aspects of the present disclosure.

FIG. 4 illustrates a flowchart of a method 400 for handling a read error on a block of memory device 104, according to some aspects of the present disclosure. Method 400 may be implemented by processor 109 of memory controller 106. It is understood that the operations shown in method 400 may not be exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which data describing a read failure of a set of error handling mechanisms is received. The read failure indicates that the set of error handling mechanisms handles a read error on a block of memory device 104 and fails to read data stored in the block. For example, responsive to receiving data describing the read error on the block, processor 109 may implement the set of error handling mechanisms to handle the read error. If the set of error handling mechanisms also fails to read the data stored in the block, processor 109 generates data describing the read failure of the set of error handling mechanisms.

Method 400 proceeds to operation 404, as illustrated in FIG. 4, in which a memory test is performed on the block to determine whether the block malfunctions, responsive to the read failure of the set of error handling mechanisms. For example, processor 109 includes the block of memory device 104 in test queue 304. Test queue 304 is configured to include a set of blocks of memory device 104 waiting to be tested by the memory test. Processor 109 marks the block as a temporary bad block, so that the block is not accessed before the memory test is performed on the block. Next, processor 109 determines whether there is a task to be fulfilled with higher priority than the memory test. If there is no task to be fulfilled with higher priority than the memory test, processor 109 proceeds to perform the memory test on the block. If the block fails the memory test, processor 109 marks the block as a bad block. On the other hand, if the block passes the memory test, processor 109 identifies the block as a candidate block for recycling during a garbage collection of memory device 104. In some implementations, processor 109 may perform the memory test for each block included in test queue 304.

Figure 5A:
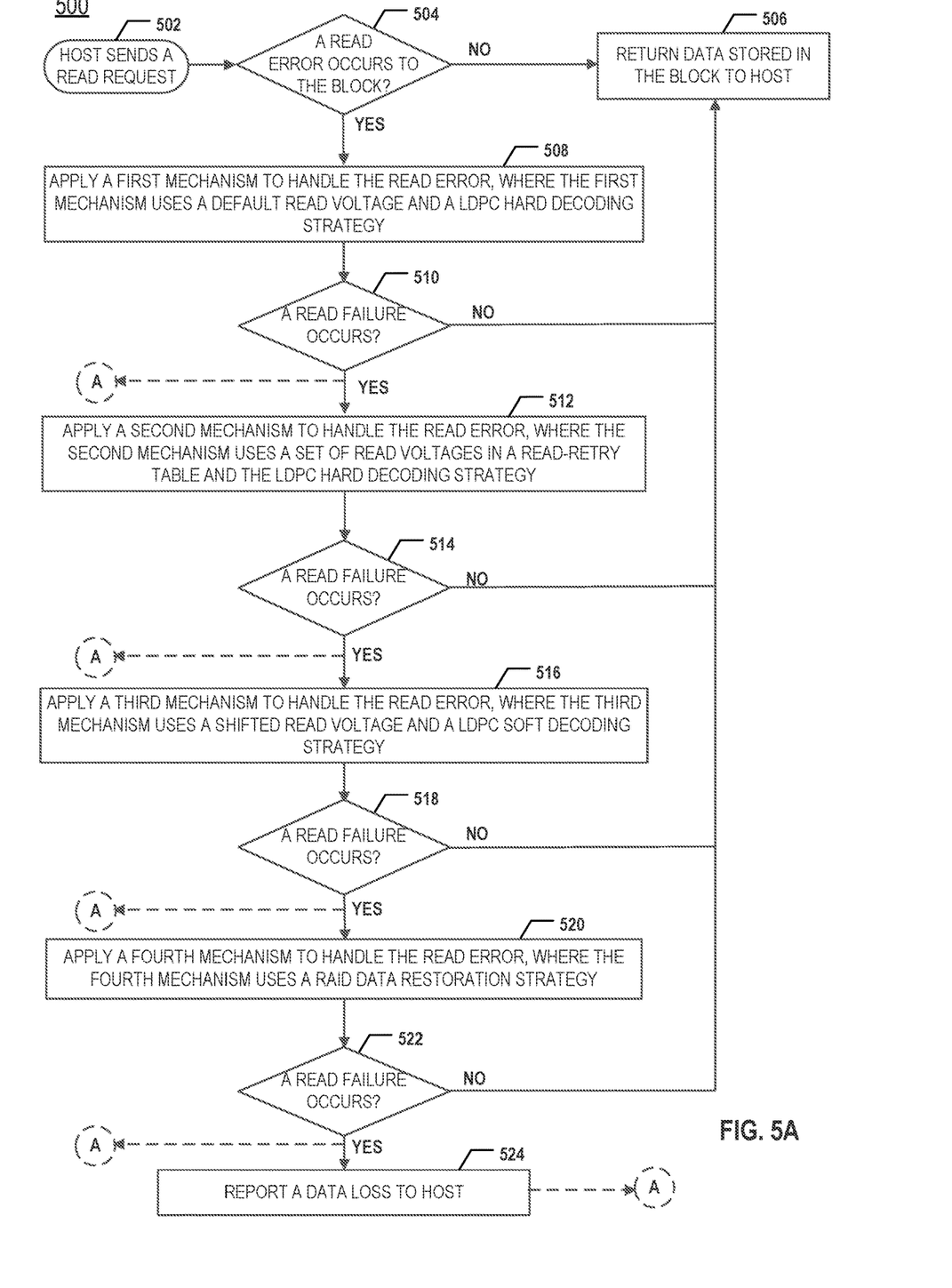
FIGS. 5A-5B illustrate a flowchart of another method for handling a read error on a block of a memory device, according to some aspects of the present disclosure.
Figure 5B:
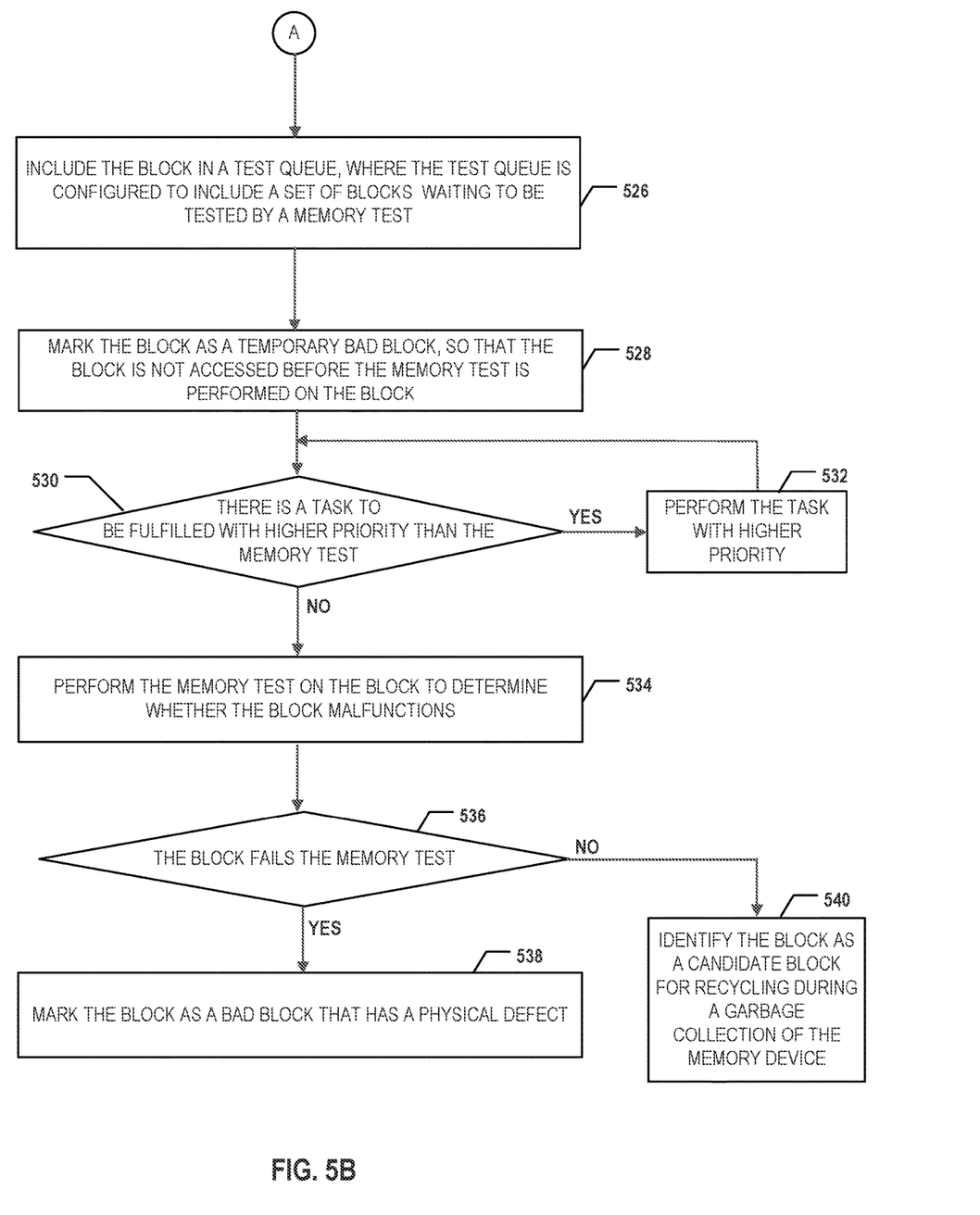

FIGS. 5A-5B illustrate a flowchart of another method 500 for handling a read error on a block of memory device 104, according to some aspects of the present disclosure. Method 500 may be implemented by processor 109 of memory controller 106. It is understood that the operations shown in method 500 may not be exhaustive and that other operations can be performed as well before, after, or between any of the illustrated operations. Further, some of the operations may be performed simultaneously, or in a different order than shown in FIGS. 5A-5B.

Referring to FIG. 5A, method 500 starts at operation 502, in which host 108 sends a read request for reading data stored in a block of memory device 104 to memory controller 106. Responsive to receiving the read request, processor 109 may perform a read operation to read data stored in the block.

Method 500 proceeds to operation 504, as illustrated in FIG. 5A, in which processor 109 determines whether a read error occurs to the block. If there is no read error on the block (e.g., the data stored in the block is read successfully with no errors), method 500 proceeds to operation 506. Otherwise, method 500 proceeds to operation 508.

At operation 506, the data stored in the block is returned to host 108. For example, processor 109 returns the data to host 108.

At operation 508, a first mechanism is applied to handle the read error. The first mechanism uses a default read voltage and an LDPC hard decoding strategy. For example, processor 109 is configured to apply the first mechanism to handle the read error.

Method 500 proceeds to operation 510, as illustrated in FIG. 5A, in which processor 109 determines whether a read failure occurs to the first mechanism. If the read failure occurs to the first mechanism, method 500 proceeds to operation 512. Otherwise, method 500 proceeds to operation 506.

At operation 512, a second mechanism is applied to handle the read error. The second mechanism uses a set of read voltages in a read-retry table and the LDPC hard decoding strategy. For example, processor 109 is configured to apply the second mechanism to handle the read error.

Method 500 proceeds to operation 514, as illustrated in FIG. 5A, in which processor 109 determines whether a read failure occurs to the second mechanism. If the read failure occurs to the second mechanism, method 500 proceeds to operation 516. Otherwise, method 500 proceeds to operation 506.

At operation 516, a third mechanism is applied to handle the read error. The third mechanism uses a shifted read voltage and an LDPC soft decoding strategy. For example, processor 109 is configured to apply the third mechanism to handle the read error.

Method 500 proceeds to operation 518, as illustrated in FIG. 5A, in which processor 109 determines whether a read failure occurs to the third mechanism. If the read failure occurs to the third mechanism, method 500 proceeds to operation 520. Otherwise, method 500 proceeds to operation 506.

At operation 520, a fourth mechanism is applied to handle the read error. The fourth mechanism uses a RAID data restoration strategy to recover data stored in the block. For example, processor 109 is configured to apply the fourth mechanism to handle the read error.

Method 500 proceeds to operation 522, as illustrated in FIG. 5A, in which processor 109 determines whether a read failure occurs to the fourth mechanism. If the read failure occurs to the fourth mechanism, method 500 proceeds to operation 524. Otherwise, method 500 proceeds to operation 506.

At operation 524, a data loss on the block is reported to host 108. For example, processor 109 reports the data loss on the block to host 108.

With reference to FIG. 5A, operations illustrated in FIG. 5B can be performed before operation 512 if the read failure occurs to the first mechanism. Alternatively, operations illustrated in FIG. 5B can be performed before operation 516 if the read failure also occurs to the second mechanism. Alternatively, operations illustrated in FIG. 5B can be performed before operation 520 if the read failure also occurs to the third mechanism. Alternatively, operations illustrated in FIG. 5B can be performed after operation 522 (before or after operation 524), if the read failure also occurs to the fourth mechanism.

Referring to FIG. 5B, method 500 proceeds to operation 526, in which the block is included in a test queue. The test queue is configured to include a set of blocks waiting to be tested by a memory test. For example, processor 109 pushes the block to the test queue.

Method 500 proceeds to operation 528, as illustrated in FIG. 5B, in which the block is marked as a temporary bad block, so that the block is not accessed before the memory test is performed on the block. For example, processor 109 marks the block as a temporary bad block.

Method 500 proceeds to operation 530, as illustrated in FIG. 5B, in which processor 109 determines whether there is a task to be fulfilled with higher priority than the memory test. If there is a task having a higher priority than the memory test, method 500 proceeds to operation 532. Otherwise, method 500 proceeds to operation 534.

At operation 532, the task with higher priority than the memory test is performed. For example, processor 109 performs the task, and then returns to operation 530.

At operation 534, the memory test is performed on the block to determine whether the block malfunctions. For example, processor 109 performs the memory test on the block to determine whether the block is a bad block. In some implementations, processor 109 may perform the memory test on each block in the test queue, so that each block in the test queue can be determined whether it is malfunctioning (e.g., operations 534, 536, 538, and 540 can be performed for each block in the test queue).

Method 500 proceeds to operation 536, as illustrated in FIG. 5B, in which processor 109 determines whether the block fails the memory test. If the block fails the memory test, method 500 proceeds to operation 538. Otherwise, method 500 proceeds to operation 540.

At operation 538, the block is marked as a bad block that has a physical defect. For example, processor 109 identifies the block as a bad block and updates a mapping table to include the block.

At operation 540, the block is identified as a candidate block for recycling during a garbage collection of memory device 104. For example, processor 109 releases the block from a list of temporary bad blocks, and pushes the block to a target block list of the garbage collection, so that the block can be recycled during the garbage collection and reused for data storage again.

According to one aspect of the present disclosure, a controller for controlling a memory device includes a memory and a processor coupled to the memory. The memory is configured to store instructions. The processor is configured to execute the instructions to perform a process including receiving data describing a read failure of a set of error handling mechanisms, where the read failure indicates that the set of error handling mechanisms handles a read error on a block of the memory device and fails to read data stored in the block; and responsive to the read failure of the set of error handling mechanisms, performing a memory test on the block to determine whether the block malfunctions.

In some implementations, the processor is configured to execute the instructions to perform the process further, including: including the block of the memory device in a test queue, where the test queue is configured to include a set of blocks of the memory device waiting to be tested by the memory test; and marking the block of the memory device as a temporary bad block, so that the block is not accessed before the memory test is performed on the block.

In some implementations, the processor is configured to execute the instructions to perform the process further including determining whether there is a task to be fulfilled with higher priority than the memory test, where the memory test on the block is performed responsive to there is no task to be fulfilled with higher priority than the memory test.

In some implementations, to perform the memory test on the block to determine whether the block malfunctions, the processor is configured to execute the instructions to perform the process further including responsive to determining that the block fails the memory test, marking the block as a bad block that has a physical defect; or responsive to determining that the block passes the memory test, identifying the block as a candidate block for recycling during a garbage collection of the memory device.

In some implementations, the processor is configured to execute the instructions to perform the process further including receiving data describing the read error on the block; applying the set of error handling mechanisms to handle the read error on the block to determine whether the set of error handling mechanisms reads the data stored in the block successfully; and responsive to the set of error handling mechanisms failing to read the data stored in the block, generating the data describing the read failure of the set of error handling mechanisms.

In some implementations, to apply the set of error handling mechanisms to handle the read error on the block, the processor is configured to execute the instructions to perform the process further including: applying a first mechanism to handle the read error on the block to determine whether the first mechanism reads the data stored in the block successfully, where the first mechanism uses a default read voltage to read the data stored in the block and applies a LDPC hard decoding strategy for data decoding; responsive to the first mechanism failing to read the data stored in the block, applying a second mechanism to handle the read error on the block to determine whether the second mechanism reads the data stored in the block successfully, where the second mechanism uses a set of read voltages in a read-retry table to read the data stored in the block and applies the LDPC hard decoding strategy for data decoding; and responsive to the second mechanism failing to read the data stored in the block, applying a third mechanism to handle the read error on the block to determine whether the third mechanism reads the data stored in the block successfully, where the third mechanism uses a shifted read voltage to read the data stored in the block and applies a LDPC soft decoding strategy for data decoding.

In some implementations, to generate the data describing the read failure of the set of error handling mechanisms, the processor is configured to execute the instructions to perform the process further including responsive to the third mechanism failing to read the data stored in the block, generating the data describing the read failure to indicate that each of the first mechanism, the second mechanism, and the third mechanism fails to read the data stored in the block.

In some implementations, the processor is configured to execute the instructions to perform the process further including responsive to the third mechanism failing to read the data stored in the block, applying a fourth mechanism to handle the read error on the block to determine whether the fourth mechanism reads the data stored in the block successfully, where the fourth mechanism uses a RAID data restoration strategy to handle the read error on the block.

In some implementations, the processor is configured to execute the instructions to perform the process further including responsive to the fourth mechanism failing to read the data stored in the block, reporting a data loss on the block to a host; or responsive to the fourth mechanism reading the data stored in the block successfully, returning the data stored in the block to the host.

According to another aspect of the present disclosure, a system includes a memory device and a controller. The memory device is configured to store data and includes an array of memory cells. The array of memory cells is organized into a plurality of blocks. The controller is coupled to the memory device and configured to control the memory device. The controller includes a memory and a processor. The memory is configured to store instructions. The processor is coupled to the memory and configured to execute the instructions to perform a process including receiving data describing a read failure of a set of error handling mechanisms, where the read failure indicates that the set of error handling mechanisms handles a read error on a block of the memory device and fails to read data stored in the block; and responsive to the read failure of the set of error handling mechanisms, performing a memory test on the block to determine whether the block malfunctions.

In some implementations, the system further includes a host coupled to the memory controller and configured to send or receive the data stored in the memory device.

In some implementations, the processor is configured to execute the instructions to perform the process further including the block of the memory device in a test queue, where the test queue is configured to include a set of blocks of the memory device waiting to be tested by the memory test; and marking the block of the memory device as a temporary bad block, so that the block is not accessed before the memory test is performed on the block.

In some implementations, the processor is configured to execute the instructions to perform the process further including determining whether there is a task to be fulfilled with higher priority than the memory test, where the memory test on the block is performed responsive to there is no task to be fulfilled with higher priority than the memory test.

In some implementations, to perform the memory test on the block to determine whether the block malfunctions, the processor is configured to execute the instructions to perform the process further including responsive to determining that the block fails the memory test, marking the block as a bad block that has a physical defect; or responsive to determining that the block passes the memory test, identifying the block as a candidate block for recycling during a garbage collection of the memory device.

In some implementations, the processor is configured to execute the instructions to perform the process further including receiving data describing the read error on the block; applying the set of error handling mechanisms to handle the read error on the block to determine whether the set of error handling mechanisms reads the data stored in the block successfully; and responsive to the set of error handling mechanisms failing to read the data stored in the block, generating the data describing the read failure of the set of error handling mechanisms.

In some implementations, to apply the set of error handling mechanisms to handle the read error on the block, the processor is configured to execute the instructions to perform the process further including: applying a first mechanism to handle the read error on the block to determine whether the first mechanism reads the data stored in the block successfully, where the first mechanism uses a default read voltage to read the data stored in the block and applies a LDPC hard decoding strategy for data decoding; responsive to the first mechanism failing to read the data stored in the block, applying a second mechanism to handle the read error on the block to determine whether the second mechanism reads the data stored in the block successfully, where the second mechanism uses a set of read voltages in a read-retry table to read the data stored in the block and applies the LDPC hard decoding strategy for data decoding; and responsive to the second mechanism failing to read the data stored in the block, applying a third mechanism to handle the read error on the block to determine whether the third mechanism reads the data stored in the block successfully, where the third mechanism uses a shifted read voltage to read the data stored in the block and applies a LDPC soft decoding strategy for data decoding.

In some implementations, to generate the data describing the read failure of the set of error handling mechanisms, the processor is configured to execute the instructions to perform the process further including responsive to the third mechanism failing to read the data stored in the block, generating the data describing the read failure to indicate that each of the first mechanism, the second mechanism, and the third mechanism fails to read the data stored in the block.

In some implementations, the processor is configured to execute the instructions to perform the process further including responsive to the third mechanism failing to read the data stored in the block, applying a fourth mechanism to handle the read error on the block to determine whether the fourth mechanism reads the data stored in the block successfully, where the fourth mechanism uses a RAID data restoration strategy to handle the read error on the block.

In some implementations, the processor is configured to execute the instructions to perform the process further including responsive to the fourth mechanism failing to read the data stored in the block, reporting a data loss on the block to a host; or responsive to the fourth mechanism reading the data stored in the block successfully, returning the data stored in the block to the host.

According to still another aspect of the present disclosure, a method for handling a read error on a block of a memory device is included. Data describing a read failure of a set of error handling mechanisms is received. The read failure indicates that the set of error handling mechanisms handles the read error on the block and fails to read data stored in the block. Responsive to the read failure of the set of error handling mechanisms, a memory test is performed on the block to determine whether the block malfunctions.

In some implementations, the block of the memory device is included in a test queue. The test queue is configured to include a set of blocks of the memory device waiting to be tested by the memory test. The block of the memory device is marked as a temporary bad block, so that the block is not accessed before the memory test is performed on the block.

In some implementations, it is determined whether there is a task to be fulfilled with higher priority than the memory test. The memory test on the block is performed responsive to there is no task to be fulfilled with higher priority than the memory test.

In some implementations, performing the memory test on the block to determine whether the block malfunctions include responsive to determining that the block fails the memory test, marking the block as a bad block that has a physical defect; or responsive to determining that the block passes the memory test, identifying the block as a candidate block for recycling during a garbage collection of the memory device.

In some implementations, data describing the read error on the block is received. The set of error handling mechanisms is applied to handle the read error on the block to determine whether the set of error handling mechanisms reads the data stored in the block successfully. Responsive to the set of error handling mechanisms failing to read the data stored in the block, the data describing the read failure of the set of error handling mechanisms is generated.

In some implementations, applying the set of error handling mechanisms to handle the read error on the block to determine whether the set of error handling mechanisms reads the data stored in the block successfully includes: applying a first mechanism to handle the read error on the block to determine whether the first mechanism reads the data stored in the block successfully, where the first mechanism uses a default read voltage to read the data stored in the block and applies a LDPC hard decoding strategy for data decoding; responsive to the first mechanism failing to read the data stored in the block, applying a second mechanism to handle the read error on the block to determine whether the second mechanism reads the data stored in the block successfully, where the second mechanism uses a set of read voltages in a read-retry table to read the data stored in the block and applies the LDPC hard decoding strategy for data decoding; and responsive to the second mechanism failing to read the data stored in the block, applying a third mechanism to handle the read error on the block to determine whether the third mechanism reads the data stored in the block successfully, where the third mechanism uses a shifted read voltage to read the data stored in the block and applies a LDPC soft decoding strategy for data decoding.

In some implementations, generating the data describing the read failure of the set of error handling mechanisms includes responsive to the third mechanism failing to read the data stored in the block, generating the data describing the read failure to indicate that each of the first mechanism, the second mechanism, and the third mechanism fails to read the data stored in the block.

In some implementations, responsive to the third mechanism failing to read the data stored in the block, a fourth mechanism is applied to handle the read error on the block to determine whether the fourth mechanism reads the data stored in the block successfully, where the fourth mechanism uses a RAID data restoration strategy to handle the read error on the block.

In some implementations, responsive to the fourth mechanism failing to read the data stored in the block, a data loss on the block is reported to a host; or responsive to the fourth mechanism reading the data stored in the block successfully, the data stored in the block is returned to the host.

According to yet another aspect of the present disclosure, a method for handling a read error on a block of a memory device is included. Data describing a read failure of a set of error handling mechanisms is received. The read failure indicates that the set of error handling mechanisms handles the read error on the block and fails to read data stored in the block. Responsive to the read failure of the set of error handling mechanisms, a memory test is performed on the block to determine whether the block fails the memory test. Responsive to the block failing the memory test, the block is identified as a bad block.

In some implementations, the block of the memory device is included in a test queue. The test queue is configured to include a set of blocks of the memory device waiting to be tested by the memory test. The block of the memory device is marked as a temporary bad block, so that the block is not accessed before the memory test is performed on the block.

In some implementations, it is determined whether there is a task to be fulfilled with higher priority than the memory test. The memory test on the block is performed responsive to there being no task to be fulfilled with higher priority than the memory test.

In some implementations, data describing the read error on the block is received. The set of error handling mechanisms is applied to handle the read error on the block to determine whether the set of error handling mechanisms reads the data stored in the block successfully. Responsive to the set of error handling mechanisms failing to read the data stored in the block, the data describing the read failure of the set of error handling mechanisms is generated.

In some implementations, applying the set of error handling mechanisms to handle the read error on the block to determine whether the set of error handling mechanisms reads the data stored in the block successfully includes: applying a first mechanism to handle the read error on the block to determine whether the first mechanism reads the data stored in the block successfully, where the first mechanism uses a default read voltage to read the data stored in the block and applies a LDPC hard decoding strategy for data decoding; responsive to the first mechanism failing to read the data stored in the block, applying a second mechanism to handle the read error on the block to determine whether the second mechanism reads the data stored in the block successfully, where the second mechanism uses a set of read voltages in a read-retry table to read the data stored in the block and applies the LDPC hard decoding strategy for data decoding; and responsive to the second mechanism failing to read the data stored in the block, applying a third mechanism to handle the read error on the block to determine whether the third mechanism reads the data stored in the block successfully, where the third mechanism uses a shifted read voltage to read the data stored in the block and applies an LDPC soft decoding strategy for data decoding.

In some implementations, generating the data describing the read failure of the set of error handling mechanisms includes responsive to the third mechanism failing to read the data stored in the block, generating the data describing the read failure to indicate that each of the first mechanism, the second mechanism, and the third mechanism fails to read the data stored in the block.

In some implementations, responsive to the third mechanism failing to read the data stored in the block, a fourth mechanism is applied to handle the read error on the block to determine whether the fourth mechanism reads the data stored in the block successfully. The fourth mechanism uses a RAID data restoration strategy to handle the read error on the block.

In some implementations, responsive to the fourth mechanism failing to read the data stored in the block, a data loss on the block to a host is reported.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A controller for controlling a memory device, comprising:
   a non-transitory memory configured to store instructions; and
   a processor coupled to the non-transitory memory and configured to execute the instructions to perform a process comprising:
   receiving data describing a read failure of a set of error handling mechanisms, wherein the read failure indicates that the set of error handling mechanisms handles a read error on a block of the memory device and fails to read data stored in the block; and responsive to the read failure of the set of error handling mechanisms, performing a memory test on the block to determine whether the block malfunctions;

wherein, prior to performing the memory test, pushing the block of the memory device to a test queue, wherein the test queue is configured to include a set of blocks of the memory device waiting to be tested by the memory test; and wherein, prior to performing the memory test, marking the block of the memory device as a temporary bad block, so that the block is not accessed before the memory test is performed on the block.

2. The controller of claim 1, wherein the processor is configured to execute the instructions to perform the process further comprising:

applying, during the memory test, one or more read voltages with one or more time durations to a word line coupled to the block;

detecting an output current of a plurality of memory cells in the block; and determining whether there is any abnormality occurring to the output current based, at least in part, on the detected output current of the plurality of memory cells in the block.

3. The controller of claim 1, wherein the processor is configured to execute the instructions to perform the process further comprising:

determining whether there is a task to be fulfilled with higher priority than the memory test, wherein the memory test on the block is performed responsive to there being no task to be fulfilled with higher priority than the memory test.

4. The controller of claim 1, wherein to perform the memory test on the block to determine whether the block malfunctions, the processor is configured to execute the instructions to perform the process further comprising:

responsive to determining that the block fails the memory test, marking the block as a bad block that has a physical defect; or responsive to determining that the block passes the memory test, identifying the block as a candidate block for recycling during a garbage collection of the memory device.

5. The controller of claim 1, wherein the processor is configured to execute the instructions to perform the process further comprising:

receiving data describing the read error on the block;

applying the set of error handling mechanisms to handle the read error on the block to determine whether the set of error handling mechanisms reads the data stored in the block successfully; and responsive to the set of error handling mechanisms failing to read the data stored in the block, generating the data describing the read failure of the set of error handling mechanisms.

6. The controller of claim 5, wherein to apply the set of error handling mechanisms to handle the read error on the block, the processor is configured to execute the instructions to perform the process further comprising:

applying a first mechanism to handle the read error on the block to determine whether the first mechanism reads the data stored in the block successfully, wherein the first mechanism uses a default read voltage to read the data stored in the block and applies a low density parity check (LDPC) hard decoding strategy for data decoding;

responsive to the first mechanism failing to read the data stored in the block, applying a second mechanism to handle the read error on the block to determine whether the second mechanism reads the data stored in the block successfully, wherein the second mechanism uses a set of read voltages in a read-retry table to read the data stored in the block and applies the LDPC hard decoding strategy for data decoding; and responsive to the second mechanism failing to read the data stored in the block, applying a third mechanism to handle the read error on the block to determine whether the third mechanism reads the data stored in the block successfully, wherein the third mechanism uses a shifted read voltage to read the data stored in the block and applies an LDPC soft decoding strategy for data decoding.

7. The controller of claim 6, wherein to generate the data describing the read failure of the set of error handling mechanisms, the processor is configured to execute the instructions to perform the process further comprising:

responsive to the third mechanism failing to read the data stored in the block, generating the data describing the read failure to indicate that each of the first mechanism, the second mechanism, and the third mechanism fails to read the data stored in the block.

8. The controller of claim 6, wherein the processor is configured to execute the instructions to perform the process further comprising:

responsive to the third mechanism failing to read the data stored in the block, applying a fourth mechanism to handle the read error on the block to determine whether the fourth mechanism reads the data stored in the block successfully, wherein the fourth mechanism uses a redundant array of independent disks (RAID) data restoration strategy to handle the read error on the block.

9. The controller of claim 8, wherein the processor is configured to execute the instructions to perform the process further comprising:

responsive to the fourth mechanism failing to read the data stored in the block, reporting a data loss on the block to a host; or responsive to the fourth mechanism reading the data stored in the block successfully, returning the data stored in the block to the host.

10. A system comprising:

a memory device configured to store data and comprising an array of memory cells, wherein the array of memory cells is organized into a plurality of blocks; and a controller coupled to the memory device and configured to control the memory device, the controller comprising:

a non-transitory memory configured to store instructions; and a processor coupled to the non-transitory memory and configured to execute the instructions to perform a process comprising:

receiving data describing a read failure of a set of error handling mechanisms, wherein the read failure indicates that the set of error handling mechanisms handles a read error on a block of the memory device and fails to read data stored in the block; and responsive to the read failure of the set of error handling mechanisms, performing a memory test on the block to determine whether the block malfunctions;

wherein, prior to performing the memory test, pushing the block of the memory device to a test queue, wherein the test queue is configured to include a set of blocks of the memory device waiting to be tested by the memory test; and wherein, prior to performing the memory test, marking the block of the memory device as a temporary bad block, so that the block is not accessed before the memory test is performed on the block.

11. The system of claim 10, further comprising a host coupled to the controller and configured to send data to the memory device via the controller, or receive data from the memory device via the controller.

12. A method for handling a read error on a block of a memory device, comprising:

receiving data describing a read failure of a set of error handling mechanisms, wherein the read failure indicates that the set of error handling mechanisms handles the read error on the block and fails to read data stored in the block; and responsive to the read failure of the set of error handling mechanisms, performing a memory test on the block to determine whether the block malfunctions;

wherein, prior to performing the memory test, pushing the block of the memory device to a test queue, wherein the test queue is configured to include a set of blocks of the memory device waiting to be tested by the memory test; and wherein, prior to performing the memory test, marking the block of the memory device as a temporary bad block, so that the block is not accessed before the memory test is performed on the block.

13. The method of claim 12, further comprising:

applying, during the memory test, one or more read voltages with one or more time durations to a word line coupled to the block;

detecting an output current of a plurality of memory cells in the block; and determining whether there is any abnormality occurring to the output current based, at least in part, on the detected output current of the plurality of memory cells in the block.

14. The method of claim 12, further comprising:

determining whether there is a task to be fulfilled with higher priority than the memory test, wherein the memory test on the block is performed responsive to there being no task to be fulfilled with higher priority than the memory test.

15. The method of claim 12, further comprising:

responsive to determining that the block fails the memory test, marking the block as a bad block that has a physical defect; or responsive to determining that the block passes the memory test, identifying the block as a candidate block for recycling during a garbage collection of the memory device.

16. The method of claim 12, further comprising:

receiving data describing the read error on the block;

applying the set of error handling mechanisms to handle the read error on the block to determine whether the set of error handling mechanisms reads the data stored in the block successfully; and responsive to the set of error handling mechanisms failing to read the data stored in the block, generating the data describing the read failure of the set of error handling mechanisms.

17. The method of claim 16, wherein applying the set of error handling mechanisms to handle the read error on the block to determine whether the set of error handling mechanisms reads the data stored in the block successfully comprises:

applying a first mechanism to handle the read error on the block to determine whether the first mechanism reads the data stored in the block successfully, wherein the first mechanism uses a default read voltage to read the data stored in the block and applies a low density parity check (LDPC) hard decoding strategy for data decoding;

responsive to the first mechanism failing to read the data stored in the block, applying a second mechanism to handle the read error on the block to determine whether the second mechanism reads the data stored in the block successfully, wherein the second mechanism uses a set of read voltages in a read-retry table to read the data stored in the block and applies the LDPC hard decoding strategy for data decoding; and responsive to the second mechanism failing to read the data stored in the block, applying a third mechanism to handle the read error on the block to determine whether the third mechanism reads the data stored in the block successfully, wherein the third mechanism uses a shifted read voltage to read the data stored in the block and applies an LDPC soft decoding strategy for data decoding.

18. The method of claim 17, wherein generating the data describing the read failure of the set of error handling mechanisms comprises:

responsive to the third mechanism failing to read the data stored in the block, generating the data describing the read failure to indicate that each of the first mechanism, the second mechanism, and the third mechanism fails to read the data stored in the block.

19. The method of claim 17, further comprising:

responsive to the third mechanism failing to read the data stored in the block, applying a fourth mechanism to handle the read error on the block to determine whether the fourth mechanism reads the data stored in the block successfully, wherein the fourth mechanism uses a redundant array of independent disks (RAID) data restoration strategy to handle the read error on the block.

20. The method of claim 19, further comprising:

responsive to the fourth mechanism failing to read the data stored in the block, reporting a data loss on the block to a host; or responsive to the fourth mechanism reading the data stored in the block successfully, returning the data stored in the block to the host.

* * * * *